US008623161B2

(12) United States Patent
Kaida et al.

(10) Patent No.: US 8,623,161 B2
(45) Date of Patent: Jan. 7, 2014

(54) PROCESS FOR PRODUCING ARTICLE HAVING FINE CONCAVO-CONVEX STRUCTURE ON ITS SURFACE AND PROCESS FOR PRODUCING WIRE-GRID POLARIZER

(75) Inventors: Yuriko Kaida, Tokyo (JP); Hiroshi Sakamoto, Tokyo (JP)

(73) Assignee: Asahi Glass Company, Limited, Tokyo (JP)

( * ) Notice: Subject to any disclaimer, the term of this patent is extended or adjusted under 35 U.S.C. 154(b) by 0 days.

(21) Appl. No.: 13/341,039

(22) Filed: Dec. 30, 2011

(65) Prior Publication Data

US 2012/0168065 A1 Jul. 5, 2012

Related U.S. Application Data

(63) Continuation of application No. PCT/JP2010/061204, filed on Jun. 30, 2010.

(30) Foreign Application Priority Data

Jul. 1, 2009 (JP) ................................. 2009-157292

(51) Int. Cl.
*B29C 65/48* (2006.01)
*B29D 11/00* (2006.01)
(52) U.S. Cl.
USPC ......................................................... 156/246
(58) Field of Classification Search
USPC ......................................................... 156/246
See application file for complete search history.

(56) References Cited

U.S. PATENT DOCUMENTS

| 4,395,527 | A | * | 7/1983 | Berger .............................. 528/26 |
| 4,420,518 | A | * | 12/1983 | Progar .......................... 428/40.7 |
| 5,239,005 | A | * | 8/1993 | Lee .................................. 525/210 |
| 5,378,583 | A | * | 1/1995 | Guckel et al. .................. 430/325 |
| 6,428,889 | B1 | * | 8/2002 | Nagaoka .................. 428/355 AC |
| 7,220,371 | B2 | * | 5/2007 | Suganuma .................... 264/1.31 |
| 7,354,698 | B2 | * | 4/2008 | Van Santen et al. .......... 430/311 |
| 2002/0180910 | A1 | * | 12/2002 | Umemoto et al. ............. 349/113 |
| 2004/0218112 | A1 | * | 11/2004 | Hirakata et al. ................ 349/56 |
| 2009/0052030 | A1 | | 2/2009 | Kaida et al. |
| 2010/0007827 | A1 | * | 1/2010 | Nishimura et al. ........... 349/117 |

FOREIGN PATENT DOCUMENTS

| JP | 2008207356 A | * | 9/2008 |
| JP | 2008-256975 A | | 10/2008 |
| WO | WO 2007/116972 A1 | | 10/2007 |

* cited by examiner

*Primary Examiner* — Philip Tucker
*Assistant Examiner* — Vicki Wu
(74) *Attorney, Agent, or Firm* — Foley & Lardner LLP

(57) ABSTRACT

Processes for producing an article having a fine concavo-convex structure on the surface of a transparent substrate and a wire-grid polarizer, with high quality with high productivity, with which a concavo-convex layer having a large area can easily be achieved. The process comprises a step (I) of forming an interlayer (A) on the surface of a substrate film, a step (II) of forming a concavo-convex layer (B) having a fine concavo-convex structure on its surface, on the surface of the interlayer (A) by imprinting technology, and a step (IV) of separating a laminate comprising the interlayer (A) and the concavo-convex layer (B) from the substrate film and laminating the laminate to the surface of a transparent substrate so that the interlayer (A) faces the transparent substrate side. Further, a process for producing a wire-grid polarizer employing the production process.

17 Claims, 8 Drawing Sheets

PROCESS FOR PRODUCING ARTICLE HAVING FINE CONCAVO-CONVEX STRUCTURE ON ITS SURFACE AND PROCESS FOR PRODUCING WIRE-GRID POLARIZER

CROSS-REFERENCE TO PRIORITY AND RELATED APPLICATIONS

This application is a continuation of PCT/JP2010/061204, filed Jun. 30, 2010, which claims priority to Japanese Patent Application No. 2009-157292, filed Jul. 1, 2009.

TECHNICAL FIELD

The present invention relates to a process for producing an article having a fine concavo-convex structure on its surface and a process for producing a wire-grid polarizer.

BACKGROUND ART

As an article having a fine concavo-convex structure on its surface, an optical element such as an antireflection member or a wire-grid polarizer has been known.

As a process for producing an article having a fine concavo-convex structure on its structure, for example, a method (so-called nanoimprinting technology) of applying a photocurable composition to the surface of a substrate, applying light to the photocurable composition in a state where a mold having a reverse structure of the fine concavo-convex structure on its surface is pressed against the photocurable composition to cure the photocurable composition thereby to obtain an article having a concavo-convex layer having a fine concavo-convex structure on its surface formed on the substrate has been known.

Depending on the application of an article having a fine concavo-convex structure on its surface, the substrate is required to be a transparent substrate such as a glass plate.

As a process for producing a wire-grid polarizer employing a glass plate as the substrate, the following process has been known.

(1) A process comprising a step of coating the surface of a glass plate (quartz) with a photocurable composition, a step of pressing a mold having a plurality of grooves on its surface against the photocurable composition, a step of applying light to the photocurable composition in a state where a mold is pressed against the photocurable composition to cure the photocurable composition, to form a concavo-convex layer having a plurality of ridges corresponding to the grooves of the mold on its surface on the glass plate, a step of separating the mold from the concavo-convex layer, and a step of forming a metal layer on the ridges of the concavo-convex layer (Patent Document 1).

PRIOR ART DOCUMENT

Patent Document

Patent Document 1: WO2007/116972

DISCLOSURE OF INVENTION

Technical Problem

However, the process (1) has the following problems.
(i) In a case where a wire-grid polarizer has a large area, it is required that the glass plate and the mold also have a large area. In the case of a large area, the force when the mold is pressed against the photocurable composition on the surface of the glass plate is required to be increased. However, as the glass plate and the mold are both rigid, when they are strongly pressed, the surface accuracy of the surface of the glass plate tends to be reduced, and the mold is likely to be broken.

(ii) Since the glass plate as the substrate is rigid, a method (roll to roll method) of pressing a mold in the roll form against the substrate so as to wind the substrate on the mold cannot be employed. Accordingly, the productivity of the wire-grid polarizer tends to be low.

(iii) In order to selectively form a metal layer on the ridges of the concavo-convex layer, usually oblique vapor deposition is carried out. In a case where oblique vapor deposition is carried out, it is required to tilt the substrate having the concavo-convex layer formed on its surface relative to the flow of a substance to be deposited from a deposition source. In principle, such can be achieved by attaching a rotating mechanism to a fixing jig of the substrate. However, considering the productivity, continuous or intermittent transport of the substrate is required. In such a case, if the substrate is transported in a horizontal direction, a film of the evaporating substance evaporating from the deposition source in an oblique direction is formed, and as the amount of the evaporating substance in an oblique direction is small as compared with the amount of the evaporating substance in the vertical direction, the film deposition efficiency will be decreased. Further, although there is a method of transporting the substrate in an oblique direction to improve the efficiency for utilization of the evaporating substance, a device will be required for the substrate fixing and transporting system, and the apparatus tends to be complicated.

The problems (i) to (iii) are problems which have arisen due to the substrate being rigid. Accordingly, to solve the problems, a method of forming the concavo-convex layer on the surface of a flexible substrate, i.e. the following method can be considered.

(2) A process for forming a concavo-convex layer on the surface of a substrate film made of a resin by nanoimprinting technology, further forming a metal layer on ridges of the concavo-convex layer, and then laminating a laminate comprising the substrate film, the concavo-convex layer and the metal layer to the surface of a glass plate.

However, the process (2) is considered to have the following problems.

(iv) Due to a difference in the coefficient of linear expansion between the substrate film and the concavo-convex layer, the temperature properties tend to be low, and the quality will be decreased with a change in the temperature.

(v) Due to a low flatness of the substrate film, optical properties of the wire-grid polarizer will be decreased.

(vi) As the wire-grid polarizer becomes thick corresponding to the thickness of the substrate film, such a wire-grid polarizer is hardly applicable to an application for which thickness is required (e.g. a liquid crystal display).

The object of the present invention is to provide a process for producing an article having a fine concavo-convex structure on the surface of a transparent substrate with high quality with high productivity, with which it is easy to make a concavo-convex layer have a large area.

Further, it is an object of the present invention to provide a process for producing a wire-grid polarizer having a fine concavo-convex structure on the surface of a transparent substrate with high quality with high productivity, with which a concavo-convex layer having a large area can easily be achieved.

Solution to Problem

In order to achieve the above objects, the present invention provides the following.

[1] A process for producing an article having a fine concavo-convex structure on its surface, which comprises the following steps (I), (II) and (V):

(I) a step of forming an interlayer (A) on the surface of a substrate film;

(II) a step of forming a concavo-convex layer (B) having a fine concavo-convex structure on its surface, on the surface of the interlayer (A) by imprinting technology; and (V) a step of separating a laminate comprising the interlayer (A) and the concavo-convex layer (B) from the substrate film and laminating the laminate to the surface of a transparent substrate so that the interlayer (A) faces the transparent substrate side.

[2] The process for producing an article having a fine concavo-convex structure on its surface according to the above [1], wherein the interlayer (A) is a layer comprising a curable material which has pressure-sensitive adhesion to the substrate film in an uncured or partially cured state, and the pressure-sensitive adhesion of which to the substrate film is reduced as the curing proceeds.

[3] The process for producing an article having a fine concavo-convex structure on its surface according to the above [1], wherein the substrate film is a substrate film having a release layer on its surface, and the interlayer (A) is a layer formed by applying a pressure-sensitive adhesive to the surface of the release layer of the substrate film.

[4] The process for producing an article having a fine concavo-convex structure on its surface according to any one of the above [1] to [3], wherein the steps (I) and (II) are carried out by a roll to roll method.

[5] The process for producing an article having a fine concavo-convex structure on its surface according to any one of the above [1] to [4], which further comprises the following step (IV) between the steps (II) and (V):

(IV) a step of laminating a protective film to the surface of the concavo-convex layer (B).

[6] A process for producing a wire-grid polarizer, which comprises the following steps (I), (II), (III) and (V):

(I) a step of forming an interlayer (A) on the surface of a substrate film;

(II) a step of forming a concavo-convex layer (B) having a plurality of ridges on its surface, on the surface of the interlayer (A) by imprinting technology;

(III) a step of forming a metal layer (C) on the ridges of the concavo-convex layer (B); and (V) a step of separating a laminate comprising the interlayer (A), the concavo-convex layer (B) and the metal layer (C) from the substrate film and laminating the laminate to the surface of a transparent substrate so that the interlayer (A) faces the transparent substrate side.

[7] The process for producing a wire-grid polarizer according to the above [6], which further comprises the following step (IV) between the steps (III) and (V):

(IV) a step of laminating a protective film on the concavo-convex layer (B) and the metal layer (C).

Advantageous Effects of Invention

According to the process for producing an article having a fine concavo-convex structure on its surface of the present invention, an article having a fine concavo-convex structure on the surface of a transparent substrate can be produced with high quality with high productivity, and also a concavo-convex layer having a large area can easily be achieved.

Further, according to the process for producing a wire-grid polarizer of the present invention, a wire-grid polarizer having a fine concavo-convex structure on the surface of a transparent substrate can be produced with high quality with high productivity, and also a concavo-convex layer having a large area can easily be achieved.

DESCRIPTION OF EMBODIMENTS

Figure 1:
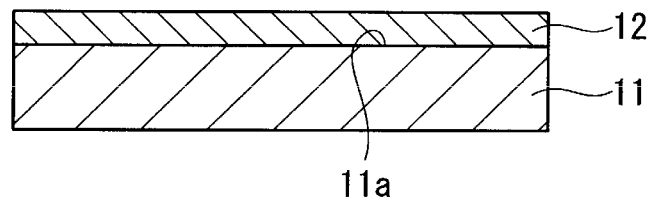
FIG. 1 is a cross-sectional view illustrating one step in the production process (process ($\alpha$)) of the present invention.

<Process for Producing Article Having Fine Concavo-Convex Structure on its Surface>

The process for producing an article having a fine concavo-convex structure on its surface of the present invention comprises the following steps (I), (II), (IV) and (V):

(I) a step of forming an interlayer (A) on the surface of a substrate film;

(II) a step of forming a concavo-convex layer (B) having a fine concavo-convex structure on its surface, on the surface of the interlayer (A) by imprinting technology;

(IV) a step of laminating a protective film to the surface of the concavo-convex layer (B) as the case requires; and (V) a step of separating a laminate comprising the interlayer (A) and the concavo-convex layer (B) from the substrate film and laminating the laminate to the surface of a transparent substrate so that the interlayer (A) faces the transparent substrate side.

As the process for producing an article having a fine concavo-convex structure on its surface of the present invention, the following processes (α) and (β) may be mentioned depending on the type of the interlayer (A).

Process (α): A case where the interlayer (A) is a layer comprising a curable material which has pressure-sensitive adhesion to the substrate film in an uncured or partially cured state, and the pressure-sensitive adhesion of which to the substrate film is reduced as the curing proceeds.

Process (β): A case where the interlayer (A) is a layer formed by applying a pressure-sensitive adhesive to the surface of a release layer of the substrate film.

The interlayer (A) in the process (α) comprises a curable material in an uncured state in the step (I) and has pressure-sensitive adhesion to the substrate film. Further, the interlayer (A) comprises, at a point where the concavo-convex layer (B) is formed by imprinting technology in the step (II), the curable material in a partially cured state, maintains the shape of the layer against the impact when the mold is separated and has pressure-sensitive adhesion to the substrate film. Further, the interlayer (A) comprises, when the laminate is separated from the substrate film in the step (V), the curable material in a state where the curing proceeds, has reduced pressure-sensitive adhesion to the substrate film so that it can readily be separated.

As described above, in the process (α), the interlayer (A) is in different states, i.e. in a state where the curable material is uncured, a state where it is partially cured and a state where the curing proceeds.

Further, as the process (α), the following processes (α1), (α2) and (α3) may be mentioned depending on the type of imprinting technology.

Process (α1): A process of forming the concavo-convex layer (B) having a fine concavo-convex structure on its surface by photoimprinting technology, wherein as the curable material, the curable material (a1) containing a photocurable compound and a thermosetting compound is used.

Process (α2): A process of forming the concavo-convex layer (B) having a fine concavo-convex structure on its surface by photoimprinting technology, wherein as the curable material, a curable material (a2) containing a thermoplastic resin and a thermosetting compound is used.

Process (α3): A process of forming the concavo-convex layer (B) having a fine concavo-convex structure on its surface by thermal-imprinting technology, wherein as the curable material, a curable material (a3) containing a thermoplastic resin and a photocurable compound is used.

Now, the processes (α1) to (α3) and (β) will be described in detail.

(Process (α1))

Step (I):

To a surface 11a of a substrate film 11, a curable material (a1)) containing a photocurable compound and a thermosetting compound is applied to form an interlayer (A) 12 on the surface 11a of the substrate film 11 as shown in FIG. 1.

In a case where the photocurable compound contained in the curable material (a1)) is not cured in the step (I), a compatible layer is formed between the interlayer (A) 12 and a concavo-convex layer (B) 13, and the adhesion of these two layers will be improved. In such a case, in the step (II), when light is applied to form a concavo-convex layer (B) 13, the photocurable compound in the interlayer (A) 12 is cured at the same time.

Further, in the step (I), after the curable material (a1)) is applied, as the case requires, light is applied to cure the photocurable compound contained in the curable material (a1) so that the interlayer (A) 12 is in a partially cured state. In a case where the photocurable compound contained in the curable material (a1)) is cured in the step (I), the shape-folding properties of the interlayer (A) 12 will be improved. When the production process of the present invention is applied to a roll to roll method, by curing the photocurable compound contained in the curable material (a1)) in the step (I), the substrate film 11 having the interlayer (A) 12 formed thereon can be once wound before carrying out the step (II).

In both cases where the photocurable compound is cured by the steps (I) and (II), as the photocurable compound is cured at a point where a mold is separated in the after-mentioned step (II), the interlayer (A) can maintain its shape against the impact when the mold is separated. On the other hand, as the thermosetting compound contained in the curable material (a1)) is not cured at a point where the mold is separated, the interlayer (A) has pressure-sensitive adhesion to the substrate film 11.

The application method may, for example, be potting, spin coating, roll coating, die coating, spray coating, casting, dip coating, screen printing or a transcription method.

Application of light may be carried out from the substrate film 11 side or may be carried out from above the applied curable material (a1)) when the substrate film 11 is light-transmitting. In a case where the substrate film 11 is not light-transmitting, application is carried out from above the applied curable material (a1). Light-transmitting in the present invention means light is transmitted. The wavelength range of the light is specifically within a range of from 400 nm to 800 nm.

As a light source of light application, a high pressure mercury lamp may, for example, be used.

As the light application, it is preferred to apply from 250 to 1,200 mJ of light having a wavelength of 365 nm, whereby both deep part curing properties and surface curing properties are favorable, and the organic material will not be deteriorated.

As the substrate film 11, for example, a film made of a resin may be used.

The resin constituting the film made of a resin may, for example, be polyethylene, polypropylene, an ethylene/propylene copolymer, an ethylene/1-butene copolymer, an ethylene/vinyl acetate copolymer, an ethylene/ethyl acrylate copolymer, an ethylene/vinyl alcohol copolymer, polyvinyl chloride, polyvinylidene chloride, polyacrylate, polystyrene, polyethylene terephthalate, polyethylene naphthalate, polybutylene terephthalate, nylon 6, nylon 6,6, or polycarbonate.

The curable material (a1) is a curable material containing a photocurable compound and a thermosetting compound.

The photocurable compound is a compound which is cured by light application to form a cured product.

The photocurable compound may be any of a polymerizable monomer, a polymerizable oligomer and a polymerizable polymer so long as it is a compound having a polymerizable group, and is preferably a polymerizable monomer. When the photocurable compound is a polymerizable monomer, the viscosity of the curable material (a1) can be made low, whereby a thin film may readily be formed.

The photocurable compound is preferably a monomer having an acryloyl group or a methacryloyl group, a monomer having a vinyl group, a monomer having an allyl group or a monomer having an oxiranyl group, more preferably a monomer having an acryloyl group or a methacryloyl group.

Specifically, it is preferably (meth)acrylic acid, a (meth) acrylate, (meth)acrylamide, a vinyl ether, a vinyl ester, an allyl ether, an allyl ester or a styrene compound, particularly preferably a (meth)acrylate. (Meth)acrylic acid generically means acrylic acid and methacrylic acid, a (meth)acrylate generically means an acrylate and a methacrylate, and (meth) acrylamide generically means acrylamide and methacrylamide.

As specific examples of the (meth)acrylate, the following compounds may be mentioned.

A mono(meth)acrylate such as ethyl (meth)acrylate, n-butyl (meth)acrylate, phenoxyethyl (meth)acrylate, benzyl (meth)acrylate, stearyl (meth)acrylate, lauryl (meth)acrylate, 2-ethylhexyl (meth)acrylate, ethoxyethyl (meth)acrylate, methoxyethyl (meth)acrylate, glycidyl (meth)acrylate, tetrahydrofurfuryl (meth)acrylate, allyl (meth)acrylate, 2-hydroxyethyl (meth)acrylate, 2-hydroxypropyl (meth)acrylate, N,N-diethylaminoethyl (meth)acrylate, N,N-dimethylaminoethyl (meth)acrylate, dimethylaminoethyl (meth)acrylate, methyladamantyl (meth)acrylate, ethyladamantyl (meth) acrylate, hydroxyadamantyl (meth)acrylate, adamantyl (meth)acrylate or isobornyl (meth)acrylate.

A di(meth)acrylate such as 1,3-butanediol di(meth)acrylate, 1,4-butanediol di(meth)acrylate, 1,6-hexanediol di(meth)acrylate, diethylene glycol di(meth)acrylate, triethylene glycol di(meth)acrylate, tetraethylene glycol di(meth) acrylate, neopentyl glycol di(meth)acrylate, polyoxyethylene glycol di(meth)acrylate or tripropylene glycol di(meth)acrylate.

A tri(meth)acrylate such as trimethylolpropane tri(meth) acrylate or pentaerythritol tri(meth)acrylate.

A (meth)acrylate having at least four polymerizable groups such as dipentaerythritol hexa(meth)acrylate.

The vinyl ether may, for example, be specifically an alkyl vinyl ether (such as ethyl vinyl ether, propyl vinyl ether, isobutyl vinyl ether, 2-ethylhexyl vinyl ether or cyclohexyl vinyl ether), or a (hydroxyalkyl)vinyl ether (such as 4-hydroxybutyl vinyl ether).

The vinyl ester may, for example, be specifically vinyl acetate, vinyl propionate, vinyl (iso)butyrate, vinyl valerate, vinyl cyclohexanecarboxylate or vinyl benzoate.

The allyl ether may, for example, be specifically an alkyl allyl ether (such as ethyl allyl ether, propyl allyl ether, (iso) butyl allyl ether or cyclohexyl allyl ether).

The allyl ester may, for example, be specifically an alkyl allyl ester (such as ethyl allyl ester, propyl allyl ester or isobutyl allyl ester).

The monomer having an oxiranyl group may be a monomer having an epoxy group, a monomer having an oxetane group or a monomer having an oxazoline group. These photocurable compounds may be used alone or as a mixture of two or more.

The molecular weight of the photocurable compound is preferably from 100 to 1,000, more preferably from 200 to 800.

The photocurable compound preferably contains a (meth) acrylate having at least two polymerizable groups, whereby the cured product of the photocurable compound has high mechanical strength. It may, for example, be specifically 1,3-butanediol diacrylate, 1,4-butanediol diacrylate, 1,6-hexanediol diacrylate, trimethylolpropane triacrylate, pentaerythritol triacrylate, dipentaerythritol hexaacrylate, diethylene glycol diacrylate, neopentyl glycol diacrylate, polyoxyethylene glycol diacrylate or tripropylene glycol diacrylate.

The mass proportion of the photocurable compound is preferably from 20 to 80 mass %, more preferably from 30 to 70 mass %, particularly preferably from 35 to 65 mass %, in 100 mass % of the curable material (a1). When the proportion of the photocurable compound is at least 20 mass %, the pressure-sensitive adhesion of the interlayer (A) 12 can readily be obtained, and the pressure-sensitive adhesion of the interlayer (A) 12 after curing is likely to be reduced. When the mass proportion of the photocurable compound is at most 80 mass %, the fluidity of the interlayer (A) 12 is likely to be reduced, and the shape will readily be held.

The curable material (a1) preferably contains a photopolymerization initiator. The photopolymerization initiator is a compound which induces a radical reaction or an ionic reaction by light.

The photopolymerization initiator may, for example, be the following initiator.

Acetophenone type photopolymerization initiator: acetophenone, p-(tert-butyl)-1',1',1'-trichloroacetophenone, chloroacetophenone, 2',2'-diethoxyacetophenone, hydroxyacetophenone, 2,2-dimethoxy-2'-phenylacetophenone, 2-aminoacetophenone, dialkylaminoacetophenone, etc.

Benzoin type photopolymerization initiator: benzyl, benzoin, benzoin methyl ether, benzoin ethyl ether, benzoin isopropyl ether, benzoin isobutyl ether, 1-hydroxycyclohexyl phenyl ketone, 2-hydroxy-2-methyl-1-phenyl-2-methylpropan-1-one, 1-(4-isopropylphenyl)-2-hydroxy-2-methylpropan-1-one, benzyl dimethyl ketal, etc.

Benzophenone type photopolymerization initiator: benzophenone, benzoyl benzoic acid, benzoyl methyl benzoate, methyl-o-benzoyl benzoate, 4-phenylbenzophenone, hydroxybenzophenone, hydroxypropylbenzophenone, acrylbenzophenone, 4,4'-bis(dimethylamino)benzophenone, etc.

Thioxanthone type photopolymerization initiator: thioxanthone, 2-chlorothioxanthone, 2-methylthioxanthone, diethylthioxanthone, dimethylthioxanthone, etc.

Photopolymerization initiator containing a fluorine atom: perfluoro(tert-butyl peroxide), perfluorobenzoyl peroxide, etc.

Other photopolymerization initiators: α-acyloxime ester, benzyl-(o-ethoxycarbonyl)-α-monooxime, acylphosphineoxide, glyoxyester, 3-ketocoumarin, 2-ethylanthraquinone, camphorquinone, tetramethylthiuram sulfide, azobisisobutyronitrile, benzoyl peroxide, dialkyl peroxide, tert-butyl peroxypivalate, etc.

The mass proportion of the photopolymerization initiator is preferably from 0.1 to 8 mass %, more preferably from 0.2 to 5 mass %, particularly preferably from 0.5 to 2 mass % in 100% of the curable material (a1). When the proportion of the photopolymerization initiator is at least 0.1 mass %, the photocurable compound will readily be polymerized to form a cured product. When the proportion of the photopolymerization initiator is at most 8 mass %, the residue of the photopolymerization initiator will be small, and physical properties of the interlayer (A) 12 will hardly be impaired.

The thermosetting compound is such a compound that it is not cured when the photocurable compound is cured by the light application, and it can form a crosslinked structure by itself or with a different compound by heat treatment.

The thermosetting compound which can form a crosslinked structure by itself is preferably a thermosetting resin. The compound which can form a crosslinked structure with a different compound is preferably a curing agent having a functional group reactive with a hydroxy group.

The thermosetting resin may, for example, be an epoxy resin, an urethane resin or a polyimide. The thermosetting resin is used preferably in combination with a curing agent.

The curing agent of the thermosetting resin may, for example, be an imidazole such as 2-methyl-4-methylimidazole, an aliphatic amine such as tetraethylene pentamine, an aromatic amine such as diaminodimethylmethane, an acid anhydride such as pyromellitic anhydride, or a mercaptan such as trimethylolpropane tris(3-mercaptopropionate).

In a case where the photocurable compound contained in the curable material (a1)) has a functional group such as a hydroxy group, it is preferred to use a curing agent having a functional group reactive with a hydroxy group to form a crosslinked structure. In such a case, the process of curing the photocurable compound by light and the process of crosslinking hydroxy groups in the photocurable compound are preferably carried out separately as far as possible. By carrying out these two processes separately, development of the shape holding properties and the pressure-sensitive adhesion of the interlayer (A) 12 and the decrease in the pressure-sensitive properties i.e. development of releasability can definitely be separated. In order to achieve such processes, it is preferred to use a curing agent having the functional group reactive with a hydroxy group preliminarily protected by a protective group capable of leaving by heat. An example of the functional group protected by the protective group may be a blocked isocyanate group. The curing agent may, for example, be a blocked isocyanate type curing agent having a plurality of blocked isocyanate groups in its molecule.

The blocked isocyanate type curing agent is preferably one having an isocyanate group in an isocyanate curing agent blocked by e.g. caprolactone, isophorone or β-diketone.

The mass proportion of the thermosetting compound in 100 mass % of the curable material (a1), i.e. the mass proportion of the thermosetting resin and the curing agent in total or the curing agent having a functional group reactive with a hydroxy group, is preferably from 20 to 80 mass %, more preferably from 30 to 70 mass %, particularly preferably from 35 to 65 mass %. When the mass proportion is at least 20 mass %, the interlayer (A) 12 can readily have pressure-sensitive adhesion, and the pressure-sensitive adhesion of the interlayer (A) after curing is likely to be reduced. Further, when the mass proportion is at most 80 mass %, the fluidity of the interlayer (A) will be reduced, and its shape will readily be held.

When the curable material (a1)) is applied, no solvent is used, or if a solvent is used to prepare the curable material (a1), the solvent is removed as far as possible. By curing the curable material (a1)) in a state where substantially no solvent is contained, the volume shrinkage of the curable material (a1)) will be small.

The viscosity of the curable material (a1)) or a solution of the curable material (a1) at 25° C. is preferably from 1 to 2,000 mPa·s, particularly preferably from 5 to 1,000 mPa·s. When the viscosity is within such a range, a smooth coating film can readily be formed e.g. by spin coating.

The viscosity in the present invention is measured by using a rotational viscometer at a temperature of 25° C.

The thickness of the interlayer (A) 12 is preferably from 0.5 to 10 μm.

Figure 2:
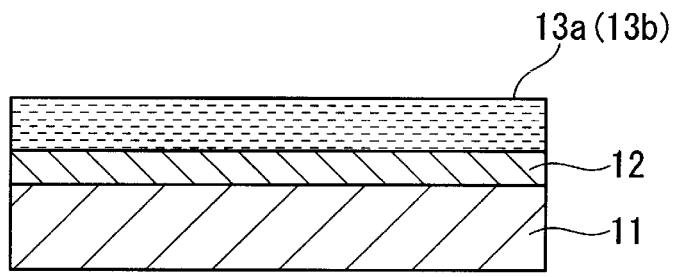
FIG. 2 is a cross-sectional view illustrating one step in the production process (process ($\alpha$)) of the present invention.
Figure 3:
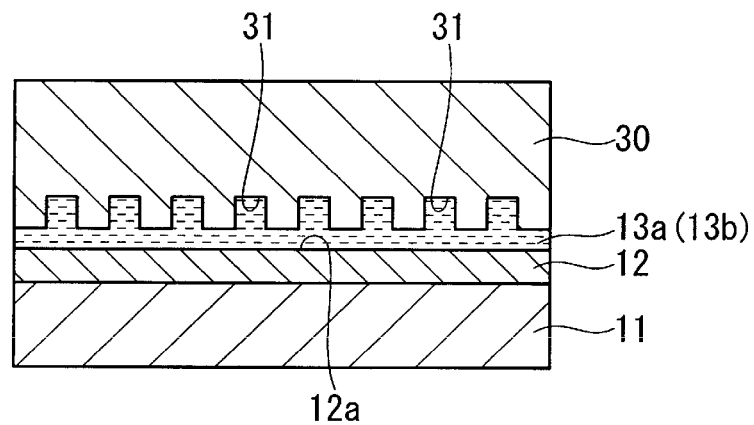
FIG. 3 is a cross-sectional view illustrating one step in the production process (process ($\alpha$)) of the present invention.
Figure 4:
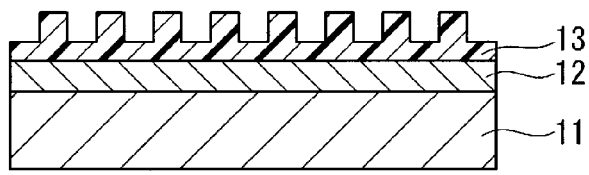
FIG. 4 is a cross-sectional view illustrating one step in the production process (process ($\alpha$)) of the present invention.

Step (II):

As shown in FIG. 2, a photocurable composition 13a is applied to a surface 12a of the interlayer (A) 12, as shown in FIG. 3, a mold 30 having a reverse structure 31 of a fine concavo-convex structure on its surface is pressed against the photocurable composition 13a so that the reverse structure 31 is in contact with the photocurable composition 13a, and light is applied in a state where the photocurable composition 13a is sandwiched between the mold face of the mold 30 having the reverse structure 31 and the surface 12a of the interlayer (A) 12 to cure the photocurable composition 13a to form a cured product, and as shown in FIG. 4, the mold 30 is separated from a cured product of the photocurable composition 13a to form a concavo-convex layer (B) 13 having a fine concavo-convex structure corresponding to the reverse structure 31 on its surface.

The photocurable composition 13a is cured by the light application, and by the light application, curing of the thermosetting compound contained in the interlayer (A) 12 will not proceed. Accordingly, the interlayer (A) 12 at a point where the concavo-convex layer (B) 13 is formed still has pressure-sensitive adhesion. Further, even when the photocurable compound contained in the interlayer (A) 12 is not cured in the step (I), by the light application at the time of forming the concavo-convex layer (B) 13, the photocurable compound contained in the interlayer (A) 12 is cured, and accordingly, the interlayer (A) 12 can hold its shape against the impact when the mold 30 is separated.

As the method of applying the photocurable composition 13a, the same method as the method of applying the curable material (a1)) may be employed.

The press pressure (gauge pressure) when the mold 30 is pressed against the photocurable composition 13a is preferably higher than 0 MPa and at most 10 MPa.

The light application may be carried out from the substrate film 11 side or may be carried out from the mold 30 side, in a case where the substrate film 11, the interlayer (A) 12 and the mold 30 are light-transmitting. In a case where one of the substrate film 11 and the interlayer (A) 12, and the mold 30, is light-transmitting and the other is not light-transmitting, it is carried out from the light-transmitting side.

As a light source for the light application, a high pressure mercury lamp may, for example, be used.

It is preferred to apply from 250 to 1,200 mJ of light having a wavelength of 365 nm, whereby both deep part curing properties and surface curing properties are favorable, and the organic material will not be deteriorated.

The mold 30 has a reverse structure 31 corresponding to the fine concavo-convex structure to be formed on the surface of the concavo-convex layer (B) 13, on its surface.

The material of the mold 30 is preferably quartz, silicone or nickel. In a case where the substrate film 11 is not light-transmitting, the material of the mold 30 is preferably light-transmitting one such as quartz.

The reverse structure 31 has fine convexes and/or concaves.

The convexes may, for example, be long ridges extending on the surface of the mold or protrusions dotted on the surface.

The concaves may, for example, be long grooves extending on the surface of the mold or pores dotted on the surface.

The shape of the ridges or grooves may, for example, be a linear, curved or bent shape. The ridges or the grooves may be in the form of stripes present in parallel with one another.

The cross-sectional shape in a direction perpendicular to the longitudinal direction of the ridges or the grooves may, for example, be rectangular, trapezoidal, triangular or semicircular.

The shape of the protrusions or the pores may, for example, be a triangle pole, a square pole, a hexagonal pole, a cylinder, a triangular pyramid, a quadrangular pyramid, a hexagonal pyramid, a cone, a hemisphere or a polyhedron.

The width of the ridges or the grooves is preferably from 50 nm to 500 μm, more preferably from 70 nm to 300 μm, on the average. The width of the ridges means the length of the base in the cross section in a direction perpendicular to the longitudinal direction. The width of the grooves means the length of the upper side in the cross section in a direction perpendicular to the longitudinal direction.

The width of the protrusions or the pores is preferably from 50 nm to 500 μm, more preferably from 70 nm to 300 μm, on the average. The width of the protrusions means, when the base of the protrusions is slender, the length of the base in the cross section in a direction perpendicular to the longitudinal direction of the base, and in other cases, means the maximum length at the base of each protrusion. The width of the pores means, when the opening is slender, the length of the upper side in the cross section in a direction perpendicular to the longitudinal direction of the opening, and in other cases, means the maximum length at the opening of each pore. The height of the convexes is preferably from 50 nm to 500 μm, more preferably from 70 nm to 300 μm, on the average.

The depth of the concaves is preferably from 50 nm to 500 μm, more preferably from 70 nm to 300 μm, on the average.

In a region where the convexes (or concaves) are dense in the reverse structure 31, the distance between the adjacent convexes (or concaves) is preferably from 50 nm to 500 μm, more preferably from 70 nm to 300 μm, on the average. The distance between the adjacent convexes means the distance from the terminal end of the base in the cross section of a convex to the starting end of the base in the cross section of the adjacent convex. The distance between the adjacent concaves means the distance from the terminal end of the upper side in the cross section of a concave to the starting end of the upper side in the cross section of the adjacent concave.

The minimum dimension of a convex is preferably from 20 nm to 20 μm, more preferably from 30 nm to 10 μm, particularly preferably from 40 nm to 5 μm. The minimum dimension of a convex means the minimum dimension among the width, length and height of the convex.

The minimum dimension of a concave is preferably from 20 nm to 20 μm, more preferably from 30 nm to 10 μm, particularly preferably from 40 nm to 5 μm. The minimum dimension of a concave means the minimum dimension among the width, length and depth of the concave.

The photocurable composition 13a may be a known photocurable composition usually employed in photoimprinting technology, and for example, photocurable compositions disclosed in WO2007/116972 or WO2009/041646 may be used.

As the photocurable composition 13a, the same photocurable compound as the photocurable compounds mentioned for the curable material (a1) may be used, and it preferably contains a photopolymerization initiator.

The photocurable composition 13a may contain a fluorinated compound. The fluorinated compound may be any of a monomer, an oligomer and a polymer, and it may be one having interfacial activity.

The content of the fluorinated compound in the photocurable composition 13a is preferably from 0.1 to 20 mass %, more preferably from 0.5 to 10 mass %, particularly preferably from 1 to 5 mass %. Within such a range, the photocurable composition 13a will readily be prepared, and a cured product (concavo-convex layer (B) 13) excellent in releasability from the mold 30 is likely to be formed.

The photocurable composition 13a is preferably such that the contact angle of the concavo-convex layer (B) 13 after photo-curing to water is at least 90°. When the contact angle of the cured film to water is at least 90°, at the time of forming the fine concavo-convex structure by photoimprinting technology, the releasability from the mold 30 will be improved, and a fine concavo-convex structure having higher accuracy can be formed.

When the photocurable composition 13a is applied, no solvent is used, or when a solvent is used for preparation of the photocurable composition 13a, the solvent is removed as far as possible. By curing the photocurable composition 13a in a state where substantially no solvent is contained, the volume shrinkage of the photocurable composition 13a will be small.

The viscosity of the photocurable composition 13a or a solution of the photocurable composition 13a at 25° C. is preferably from 1 to 2,000 mPa·s, particularly preferably from 5 to 1,000 mPa·s. When the viscosity is within such a range, a smooth coating film can readily be formed e.g. by spin coating.

The thickness of the concavo-convex layer (B) 13 is preferably from 0.5 to 20 μm.

A compatible layer is preferably formed between the interlayer (A) 12 and the concavo-convex layer (B) 13 in view of the adhesion between these layers. The compatible layer can readily be formed by using the photocurable compound in the curable material (b1) to form the interlayer (A) 12 and the photocurable compound in the photocurable composition 13a forming the concavo-convex layer (B) 13 being the same type of compounds, and curing the photocurable compound contained in the interlayer (A) and the photocurable compound in the photocurable composition 13a simultaneously in the step (II).

Figure 5:
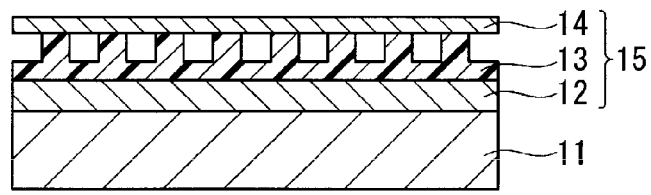
FIG. 5 is a cross-sectional view illustrating one step in the production process (process ($\alpha$)) of the present invention.

Step (IV):

As shown in FIG. 5, a protective film 14 is laminated to the surface of the concavo-convex layer (B). By laminating the protective film 14, the fine concavo-convex structure of the concavo-convex layer (B) 13 can be protected. Laminating the protective film 14 is particularly effective when the production process of the present invention is applied to a roll to roll method.

The method of laminating the protective film 14 may, for example, be a method of disposing the protective film 14 on the surface of the concavo-convex layer (B) 13, followed by treatment by an autoclave. The treatment by an autoclave is carried out preferably at from room temperature to 50° C. under from 0.5 to 5 kgf/cm$^2$ for from 5 to 60 minutes.

The protective film 14 may be any film which can protect the fine concavo-convex structure on the surface of the concavo-convex layer (B) 13. The protective film 14 may, for example, be a film with a pressure-sensitive adhesive. The pressure-sensitive adhesive is preferably a weak pressure-sensitive adhesive acrylic adhesive. It may, for example, be specifically MASTACK PC-751 (tradename, manufactured by FUJIMORI KOGYO CO., LTD.).

Figure 6:
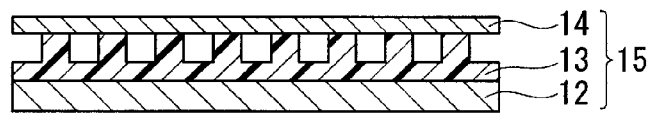
FIG. 6 is a cross-sectional view illustrating one step in the production process (process ($\alpha$)) of the present invention.
Figure 7:
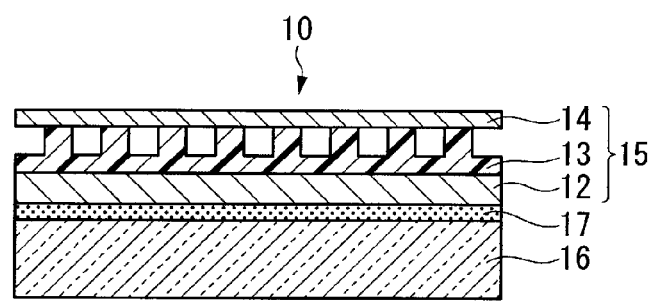
FIG. 7 is a cross-sectional view illustrating one step in the production process (process ($\alpha$)) of the present invention.

Step (V):

The thermosetting compound contained in the interlayer (A) 12 is cured by heat treatment to completely cure the interlayer (A), and then as shown in FIG. 6, a laminate 15 comprising the interlayer (A) 12, the concavo-convex layer (B) 13 and the protective film 14 is separated from the substrate film 11, an adhesive is applied to the surface of a transparent substrate 16 to form an adhesive layer 17, and as shown in FIG. 7, the laminate 15 is laminated to the transparent substrate 16 so that the interlayer (A) 12 faces the transparent substrate 16 side.

The curing reaction by the thermosetting compound is let proceed by heat treatment to completely cure the interlayer (A) 12, whereby the interlayer (A) 12 loses the pressure-sensitive adhesion, and the laminate 15 can readily be separated from the substrate film 11.

The heat treatment conditions may be any conditions so long as the interlayer (A) 12 can completely be cured, and the heat treatment is carried out preferably at from 50 to 200° C. for from 0.5 to 2 hours.

As the method of applying the adhesive, the same method of applying the curable material (a1)) may be employed.

The laminating method may, for example, be a method of disposing the laminate 15 on the surface of the adhesive layer 17 formed on the surface of the transparent substrate 16, and applying a pressure of from 0.5 to 5 kgf/cm² from above the protective film 14.

The transparent substrate 16 may be a light-transmitting formed product in the form a sheet, a film or another form. The light to be transmitted is usually visible light, and may be visible light having an ultraviolet region or an infrared region. Further, it may be light which does not contain part of wavelength in a wavelength region of from ultraviolet region to infrared region, or on the contrary, it may be light having only part of wavelength among lights in such a wavelength region. The formed product in another form other than a sheet-form transparent substrate or a film-form transparent substrate may be a formed product having a coverture surface to be used as an optical element such as a lens.

The material of the transparent substrate may be a transparent inorganic substance such as glass or a transparent organic substance such as a synthetic resin. Specifically, the inorganic substance may, for example, be soda lime glass, borosilicate glass, alkali free glass (such as borosilicate glass containing no alkali metal component), quartz glass or quartz. The inorganic substance may, for example, be a polycarbonate polymer, a methacrylate polymer, a cycloolefin polymer, a cellulose polymer (such as triacetyl cellulose) or a polystyrene polymer.

A particularly preferred transparent substrate is a sheet or film made of the above glass, quartz or the like.

The transparent substrate may be a transparent substrate having an optical function or a transparent substrate having a functional film. The transparent substrate having an optical function may, for example, be a transparent substrate (such as a quartz plate or a uniaxially oriented film) having birefringence called a wave plate. The transparent substrate having a functional film may, for example, be a transparent substrate having an optical functional film such as an antireflection film having a single layer or multilayer structure, a multilayer film having a band pass filter function, or a multilayer film layer having a low pass filter function. Such a functional film is usually provided on the surface not in contact with the interlayer (A) 12 of the transparent substrate. The surface to be in contact with the interlayer (A) 12 of the transparent substrate may be subjected to surface treatment to improve the adhesion to the interlayer (A) 12. Such surface treatment may, for example, be primer coating treatment, ozone treatment or plasma etching treatment. The primer may, for example, be a silane coupling agent or a silazane.

The thickness of the transparent substrate 16 is preferably from 0.1 to 1.0 mm, more preferably from 0.2 to 0.7 mm, when the transparent substrate is a formed product having a constant thickness, such as a sheet or a film. Further, when it is a formed product having no constant thickness, such as a lens, the thickness at the thickest portion is preferably from 0.5 to 5 mm, more preferably from 1.0 to 3.0 mm.

The adhesive to form the adhesive layer 17 may be any which can firmly bond the transparent substrate 16 and the interlayer (A) 12, and it may, for example, be a photocurable adhesive. Further, a mixture of a photocurable adhesive and a silane coupling agent may also be used.

The photocurable adhesive may, for example, be specifically LCR0632 (tradename, manufactured by TOAGOSEI CO., LTD.).

The thickness of the adhesive layer 17 is preferably from 0.2 to 5 µm. The thickness of the adhesive layer 17 is more preferably from 0.5 to 3 µm.

By the above steps (I), (II), (IV) and (V), an article 10 having a fine concavo-convex structure on its surface, comprising the transparent substrate 16, the adhesive layer 17, the interlayer (A) 12, the concavo-convex layer (B) 13 and the protective film 14 laminated, can be obtained.

(Process (α2))

Step (I):

As shown in FIG. 1, a curable material (a2) containing a thermoplastic resin and a thermosetting compound is applied to a surface 11a of a substrate film 11 to form an interlayer (A) 12. The interlayer (A) 12 in the step (I) maintains its shape by the thermoplastic resin, and the thermosetting compound is not cured, i.e. in an uncured state, and the interlayer (A) 12 has pressure-sensitive adhesion.

As the method of applying the curable material (a2), the same method of applying the curable material (a1)) may be employed.

The curable material (a2) is a curable material containing a thermoplastic resin and a thermosetting compound.

The thermosetting compound may be the same compound as the thermosetting compound mentioned for the curable material (a1).

The thermoplastic resin is preferably a resin having a glass transition temperature (Tg) of at least 10° C. and at most 40° C. When Tg is at least 10° C., the interlayer (A) 12 is likely to lose the pressure-sensitive adhesion when the thermosetting compound is cured. When Tg is at most 40° C., the interlayer (A) 12 is likely to have sufficient pressure-sensitive adhesion before curing the thermosetting compound.

The type of the thermoplastic resin is not particularly limited, but an acrylic resin or an olefin resin is preferred from the viewpoint of the compatibility with the thermosetting compound. The thermoplastic resin may, for example, be a pressure-sensitive adhesive such as SK-DYNE 1604 (tradename, manufactured by Soken Chemical & Engineering Co., Ltd.).

The mass proportion of the thermoplastic resin in 100 mass % of the curable material (a2) is preferably from 20 to 80 mass %, more preferably from 30 to 70 mass %. The mass proportion of the thermosetting compound in 100 mass % of the curable material (a2) is preferably from 20 to 80 mass %, more preferably from 30 to 70 mass %.

When the curable material (a2) is applied, it is preferably applied in the form of a solution or a dispersion of the curable material (a2) by using an organic solvent such as toluene.

The viscosity of the curable material (a2) or the solution of the curable material (a2) at 25° C. is preferably from 1 to 2,000 mPa·s, particularly preferably from 5 to 1,000 mPa·s. When the viscosity is within such a range, a smooth coating film can readily be formed e.g. by spin coating.

The thickness of the interlayer (A) 12 is the same as in the case of the process (α1).

Steps (II), (IV) and (V):

The steps (II), (IV) and (V) are the same as the steps (II), (IV) and (V) in the process (α1). In the step (II), the photocurable composition 13a is cured by light application, and curing of the thermosetting compound contained in the interlayer (A) 12 will not proceed. Accordingly, the interlayer (A) 12 in the step (II) still has pressure-sensitive adhesion. Further, since the interlayer (A) 12 contains a thermoplastic resin, the interlayer (A) 12 can maintain its shape against the impact when the mold 30 is separated, and the thermoplastic resin itself may have pressure-sensitive adhesion in some cases.

(Process (α3))

As shown in FIG. 1, a curable material (a3) containing a thermoplastic resin and a photocurable compound is applied to a surface 11*a* of a substrate film 11 to form an interlayer (A) 12. The interlayer (A) 12 in the step (I) maintains its shape by the thermoplastic resin, and the photocurable compound is not cured, i.e. in an uncured state, and the interlayer (A) 12 has pressure-sensitive adhesion.

The method of applying the curable material (a3) may be the same as the method of applying the curable material (a1).

The curable material (a3) is a curable material containing a thermoplastic resin and a photocurable compound.

The photocurable compound may be the same compound as the photocurable compound mentioned for the curable material (a1).

The thermoplastic resin may be the same resin as the thermoplastic resin mentioned for the curable material (a2).

The mass proportion of the photocurable compound in 100 mass % of the curable material (a3) is preferably from 20 to 80 mass %, more preferably from 30 to 70 mass %. The mass proportion of the thermoplastic resin in 100 mass % of the curable material (a3) is preferably from 20 to 80 mass %, more preferably from 30 to 70 mass %.

When the curable material (a3) is applied, no solvent is used, or when a solvent is used for preparation of the curable material (a3), the solvent is removed as far as possible. By curing the curable material (a3) in a state where substantially no solvent is contained, the volume shrinkage of the curable material (a3) will be small.

The viscosity of the curable material (a3) or a solution of the photocurable composition (a3) at 25° C. is preferably from 1 to 2,000 mPa·s, particularly preferably from 5 to 1,000 mPa·s. When the viscosity is within such a range, a smooth coating film can readily be formed e.g. by spin coating.

The thickness of the interlayer (A) 12 may be the same as in the case of the process (α1).

Step (II):

As shown in FIG. 2, a thermoplastic resin layer 13*b* is formed on a surface 12*a* of the interlayer (A) 12, as shown in FIG. 3, a mold 30 having a reverse structure 31 of a fine concavo-convex structure on its surface in a heated state is pressed against the thermoplastic resin layer 13*b* so that the reverse structure 31 is in contact with the thermoplastic resin layer 13*b*, and the thermoplastic resin layer 13*b* is sandwiched between the mold face of the mold 30 having the reverse pattern 31 and the surface 12*a* of the interlayer (A) 12, and as shown in FIG. 4, the temperature of the mold 30 is lowered, and the mold 30 is separated from the thermoplastic resin layer 13*b* to form a concavo-convex layer (B) 13 having a fine concavo-convex structure corresponding to the reverse structure 31 on its surface.

The photocurable compound contained in the interlayer (A) 12 is not cured even when the heated mold 30 is pressed against the thermoplastic resin layer 13*b*, and thus the interlayer (A) 12 at a point where the concavo-convex layer (B) 13 is formed still has pressure-sensitive adhesion.

The method of forming the thermoplastic resin layer 13*b* may be a method of applying and drying a solution on the thermoplastic resin, or a method of laminating a film of the thermoplastic resin.

The temperature of the mold 30 to be pressed against the thermoplastic resin layer 13*b* may be any temperature so long as it is at least the glass transition point (Tg) or the melting point (Tm) of the thermoplastic resin layer 13*b*, and is preferably from 50 to 150° C.

The press pressure (gauge pressure) when the mold 30 is pressed against the thermoplastic resin layer 13*b* is preferably more than 0 MPa and at most 10 MPa.

The thermoplastic resin to form the thermoplastic resin layer 13*b* may be a thermoplastic resin commonly used for thermo-imprinting technology, and it may, for example, be polypropylene, polyethylene, polyethylene terephthalate, polymethyl methacrylate, a cycloolefin polymer or a cycloolefin copolymer.

The solution of the thermoplastic resin may be one having the thermoplastic resin dissolved in an organic solvent.

The organic solvent may, for example, be toluene.

The thickness of the concavo-convex layer (B) 13 may be the same as in the case of the process (α1).

Step (IV):

In the same manner as in the step (IV) in the process (α1), a protective film 14 is laminated to the surface of the concavo-convex layer (B) 13 as shown in FIG. 5.

Step (V):

The photocurable compound contained in the interlayer (A) 12 is cured by applying light, and then as shown in FIG. 6, a laminate 15 comprising the interlayer (A) 12, the concavo-convex layer (B) 13 and the protective film 14 is separated from the substrate film 11, an adhesive is applied to the surface of a transparent substrate 16 to form an adhesive layer 17, and as shown in FIG. 7, the laminate 15 is laminated to the transparent substrate 16 so that the interlayer (A) 12 faces the transparent substrate 16 side.

By curing the photocurable compound contained in the interlayer (A) 12 by photo-treatment, the interlayer (A) 12 loses the pressure-sensitive adhesion, and the laminate 15 can readily be separated from the substrate film 11.

The light application may be carried out from the substrate film 11 side or may be carried out from the protective film 14 side, when the substrate film 11, the concavo-convex layer (B) 13 and the protective film 14 are light-transmitting. When one of the substrate film 11, and the concavo-convex layer (B) 13 and the protective film 14, is light-transmitting, and the other is not light-transmitting, the light application is carried out from the light-transmitting side.

As a light source for the light application, a high pressure mercury lamp may, for example, be used.

It is preferred to apply from 250 to 1,200 mJ of light having a wavelength of 365 nm, whereby both deep part curing properties and surface curing properties are favorable, and the organic material will not be deteriorated.

(Process (β))

Figure 8:
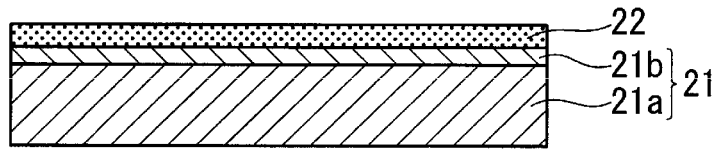
FIG. 8 is a cross-sectional view illustrating one step in the production process (process ($\beta$)) of the present invention.

Step (I):

As shown in FIG. 8, a pressure-sensitive adhesive is applied to a surface of a release layer 21*b* of a substrate film 21 having the release layer 21*b* on a surface of a film main body 21*a*, to form an interlayer (A) 22.

The method of applying the pressure-sensitive adhesive may be the same method of applying the curable material (a1).

The substrate film 21 may, for example, be one having a release film laminated to the surface of the film main body 21*a* to form a release layer 21*b*.

The film main body 21*a* may be the same as the substrate film 11.

The material of the release film is preferably a fluororesin having a fluorine atom content of at least 10 mass % in view of the releasability, the heat resistance, the strength and the elongation at high temperature.

The fluororesin having a fluorine atom content of at least 10 mass % may, for example, be polytetrafluoroethylene, a tetrafluoroethylene/hexafluoropropylene copolymer, a tetrafluoroethylene/perfluoroalkoxyethylene copolymer, an ethylene/tetrafluoroethylene copolymer, polyvinylidene fluoride, polyvinyl fluoride, a tetrafluoroethylene/hexafluoropropylene/vinylidene fluoride copolymer, polychlorotrifluoroethylene or an ethylene/chlorotrifluoroethylene copolymer.

The release film may be a film using only one type of the fluororesin, or may be a film using two or more types of the fluororesins in combination. It may also be a film using the fluororesin and a non-fluorinated resin in combination, or a film having an inorganic additive, an organic additive, etc. incorporated.

The release film is particularly preferably a film using an ethylene/tetrafluoroethylene copolymer, in view of large elongation at high temperature.

The pressure-sensitive adhesive to form the interlayer (A) 22 may be one comprising an elastomer to be the base such as an acrylic elastomer, a natural rubber, a silicon elastomer or an urethane elastomer and a crosslinking agent or an adhesion-imparting agent incorporated.

Step (II):

The step (II) is the same as either of the step (II) in the process (α1) or the step (II) in the process (α3). That is, a concavo-convex layer (B) 23 is formed either by photo-nanoimprinting technology or thermal-nanoimprinting technology. Now, an explanation will be made with reference to a case of employing photo-nanoimprinting technology as an example.

Figure 9:
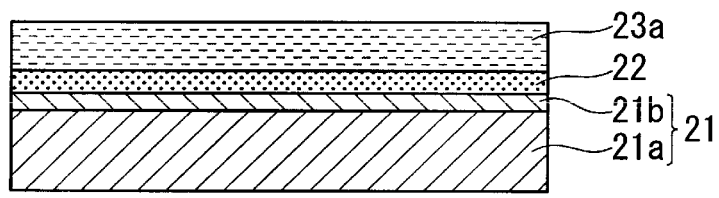
FIG. 9 is a cross-sectional view illustrating one step in the production process (process ($\beta$)) of the present invention.
Figure 10:
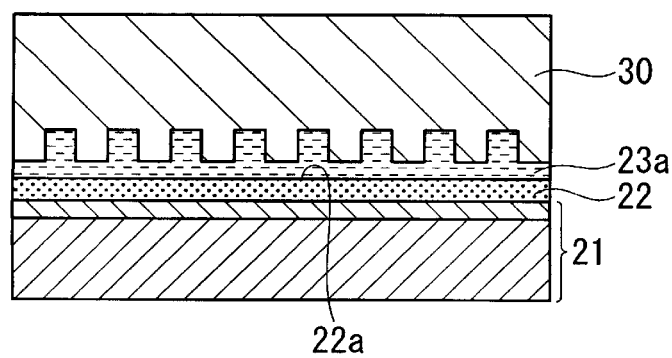
FIG. 10 is a cross-sectional view illustrating one step in the production process (process ($\beta$)) of the present invention.
Figure 11:
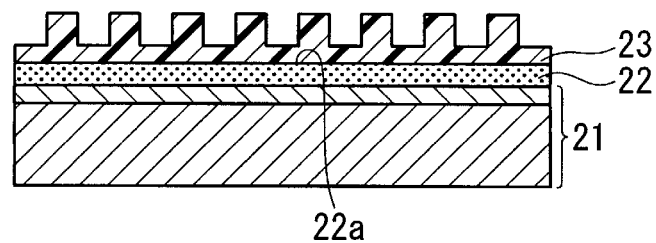
FIG. 11 is a cross-sectional view illustrating one step in the production process (process ($\beta$)) of the present invention.

As shown in FIG. 9, a photocurable composition 23a is applied to a surface 22a of the interlayer (A) 22, as shown in FIG. 10, a mold 30 having a reverse structure 31 of a fine concavo-convex structure on its surface is pressed against the photocurable composition 23a so that the reverse structure 31 is in contact with the photocurable composition 23a, and light is applied in a state where the photocurable composition 23a is sandwiched between the mold face of the mold 30 having the reverse pattern 31 and the surface 22a of the interlayer (A) 22 to cure the photocurable composition 23a to obtain a cured product, and as shown in FIG. 11, the mold 30 is separated from the cured product of the photocurable composition 23a to form a concavo-convex layer (B) 23 having a fine concavo-convex structure corresponding to the reverse structure 31 on its surface.

The photocurable composition 23a may be the same as the photocurable composition 13a.

The light application is carried out in the same manner as the light application in the process (α1).

Figure 12:
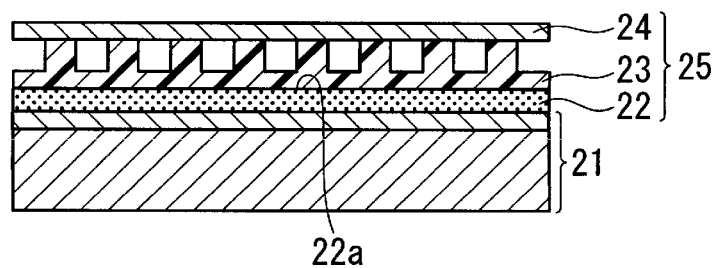
FIG. 12 is a cross-sectional view illustrating one step in the production process (process ($\beta$)) of the present invention.

Step (IV):

As shown in FIG. 12, in the same manner as the step (IV) in the process (α1), a protective film 24 is laminated to the surface of the concavo-convex layer (B) 23.

The protective film 24 may be the same one as the protective film 14.

Figure 13:
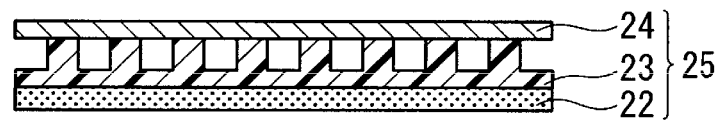
FIG. 13 is a cross-sectional view illustrating one step in the production process (process ($\beta$)) of the present invention.
Figure 14:
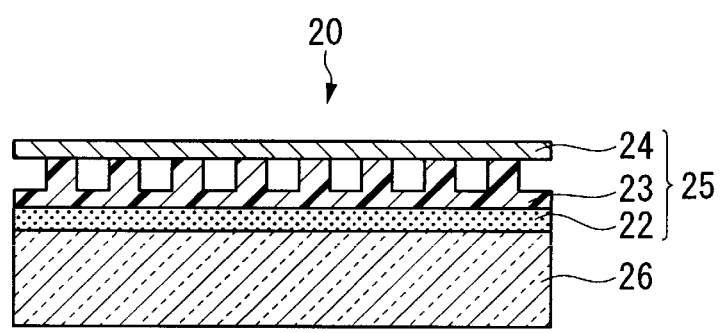
FIG. 14 is a cross-sectional view illustrating one step in the production process (process ($\beta$)) of the present invention.

Step (V):

As shown in FIG. 13, a laminate 25 comprising the interlayer (A) 22, the concavo-convex layer (B) 23 and the protective film 24 is separated from the substrate film 21, and as shown in FIG. 14, the laminate 25 separated from the substrate film 21 is laminated to a transparent substrate 26 so that the interlayer (A) 22 faces the transparent substrate side.

As the substrate film 21 has the release layer 21b, the laminate 25 can readily be separated from the substrate film 21 even in a state where the interlayer (A) 22 has pressure-sensitive adhesion.

Further, as the interlayer (A) 22 has pressure-sensitive adhesion, it can be laminated to the transparent substrate 26 even if no adhesive layer is formed on the surface of the transparent substrate 26.

By the above steps (I), (II), (IV) and (V), an article 20 having the transparent substrate 26, the interlayer (A) 22, the concavo-convex layer (B) 23 and the protective film 24 laminated can be obtained.

The process for producing an article having a fine concavo-convex structure on its surface of the present invention, in which formation of a concavo-convex layer is carried out on a substrate film which is a flexible substrate, is applicable to a roll to roll method. Thus, high productivity can readily be obtained, and it is easy to obtain a concavo-convex layer (B) having a large area can easily be achieved.

In the process for producing an article having a fine concavo-convex structure on its surface of the present invention, the steps (I) and (II) are preferably carried out by a roll to roll method.

That is, it is preferred to form the interlayer (A) on the surface of a substrate film while the substrate film is transferred by rolls (step (I)), further to apply the photocurable composition or the thermoplastic resin to the surface of the interlayer (A), and cure the photocurable composition or the thermoplastic resin while a mold in the form of a roll is rotated and pressed against the composition or the resin, thereby to continuously form the concavo-convex layer (B) (step (II)).

Figure 15:
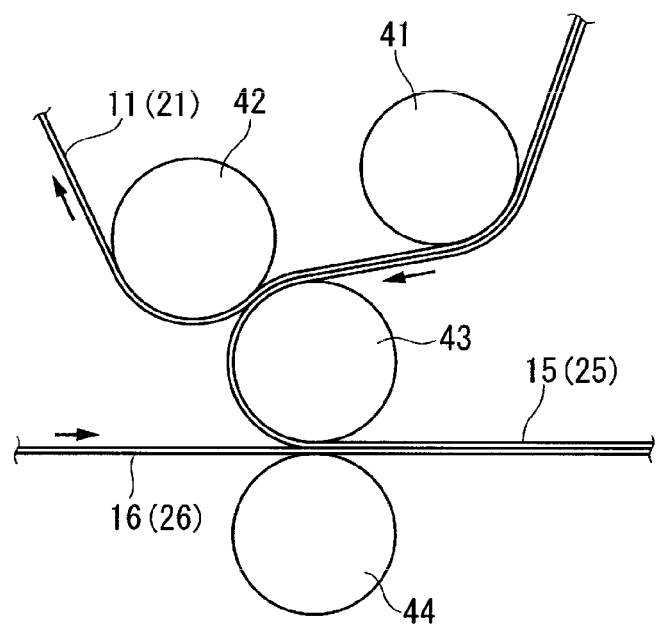
FIG. 15 is a view schematically illustrating one step when the production process of the present invention is applied to a roll to roll method.

Further, a method may also be employed wherein the steps (I), (II) and (IV) are carried out by the roll to roll method, so that a laminate comprising the substrate film, the interlayer (A), the concavo-convex layer (B) and the protective film is continuously formed, and as shown in FIG. 15, the substrate film 11 (21) and the laminate 15 (25) are transferred from a roll 41, the laminate 15 (25) is separated from the substrate film 11 (21) between rolls 42 and 43 and then laminated to a transparent substrate 16 (26) by rolls 43 and 44.

According to the above-described process for producing an article having a fine concavo-convex structure on its surface of the present invention, an article having a fine concavo-convex structure on a transparent substrate can be produced with high quality with high productivity. Further, such an article having a large area can easily be achieved.

Further, the process for producing an article having a fine concavo-convex structure on its surface of the present invention may be a process which comprises no step (IV).

The article having a fine concavo-convex structure on its surface of the present invention may, for example, be a light-transmitting substrate for an optical element such as a wire-grid polarizer, a prism, a light guide plate or a moth eye, a support substrate for a biosensor, a patterning substrate for a cell culture sheet, a process member for preparation of a member for a semiconductor, or a process member for preparation of a member for a magnetic disk.

<Wire-Grid Polarizer>

The process for producing a wire-grid polarizer of the present invention comprises the following steps (I), (II), (III), (IV) and (V):

(I) a step of forming an interlayer (A) on the surface of a substrate film;

(II) a step of forming a concavo-convex layer (B) having a plurality of ridges on its surface, on the surface of the interlayer (A) by imprinting technology;

(III) a step of forming a metal layer (C) on the ridges of the concavo-convex layer (B);

(IV) a step of laminating a protective film on the concavo-convex layer (B) and the metal layer (C) as the case requires; and (V) a separating and laminating step of separating a laminate comprising the interlayer (A), the concavo-convex layer (B) and the metal layer (C) from the substrate film and laminating the laminate to the surface of a transparent substrate so that the interlayer (A) faces the transparent substrate side.

In the process for producing a wire-grid polarizer of the present invention, the steps (I), (II), (IV) and (V) other than the step (III) are carried out by any of the processes (α1) to (α3) and (β). Now, explanation will be made with reference to the case of employing the process (α1) as an example.

Step (I):

In the same manner as the step (I) in the process (α1), as shown in FIG. 1, an interlayer (A) 12 is formed on a surface 11a of a substrate film 11.

Step (II):

In the same manner as the step (II) in the process (α1), as shown in FIG. 4, a concavo-convex layer (B) 13 is formed on a surface 12a of the interlayer (A) 12.

Figure 16:
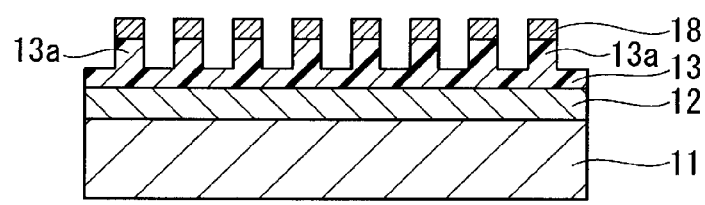
FIG. 16 is a cross-sectional view illustrating one step in the process for producing a wire-grid polarizer of the present invention.

Step (III):

As shown in FIG. 16, a metal layer (C) 18 is formed on ridges 13a of the concavo-convex layer (B) 13.

The method of forming the metal layer (C) 14 may, for example, be a vapor deposition method, a sputtering method or a plating method. It is preferably an oblique vapor deposition method, with a view to selectively forming the metal layer (C) 18 on the ridges 13a. For example, in a case where the pitch Pp of the ridges 13a is narrow and the ridges 13a are high, a metal layer can be selectively formed on the ridges 13a by carrying out oblique vapor deposition at a proper angle. Further, it is possible to form a thin metal layer by an oblique vapor deposition method and then overlay another metal layer by a plating method to form a metal layer having a desired thickness.

The material of the metal layer (C) 18 is preferably silver, aluminum, chromium or magnesium with a view to having a high reflectance to visible light, having small absorption of visible light and having a high electrical conductivity, particularly preferably aluminum.

Figure 17:
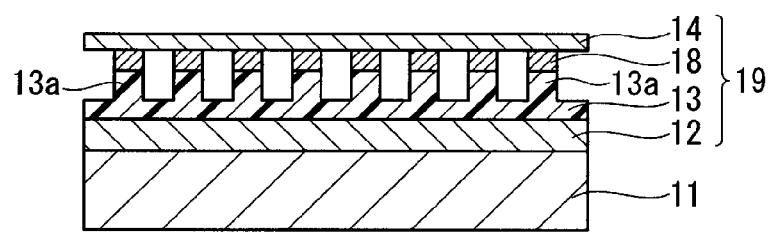
FIG. 17 is a cross-sectional view illustrating one step in the process for producing a wire-grid polarizer of the present invention.

Step (IV):

As shown in FIG. 17, a protective film 14 is laminated to the metal layer (C) 18 formed on the ridges 13a of the concavo-convex layer (B) 13.

The method of laminating the protective film 14 may be the method mentioned in the process (α1).

Figure 18:
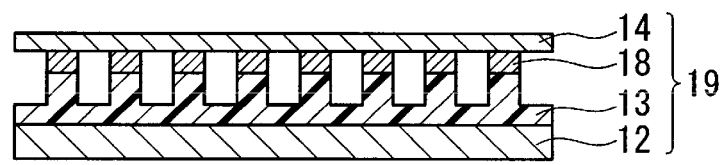
FIG. 18 is a cross-sectional view illustrating one step in the process for producing a wire-grid polarizer of the present invention.
Figure 19:
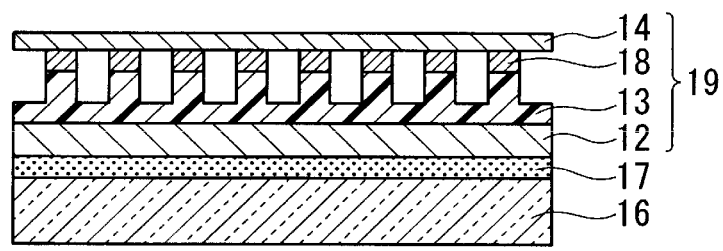
FIG. 19 is a cross-sectional view illustrating one step in the process for producing a wire-grid polarizer of the present invention.

Step (V):

The thermosetting compound contained in the interlayer (A) 12 is cured by heat treatment to completely cure the interlayer (A) 12, as shown in FIG. 18, a laminate 19 comprising the interlayer (A) 12, the concavo-convex layer (B) 13, the metal layer (C) 18 and the protective film 14 is separated from the substrate film 11, and as shown in FIG. 19, the laminate 19 is laminated to a transparent substrate 16 so that the interlayer (A) 12 faces the transparent substrate 16 side by means of an adhesive layer 17 formed by applying an adhesive to the surface.

The conditions for heat treatment, the method of applying the adhesive and the method of laminating the laminate 19 may be the conditions and methods mentioned in the process (α1).

By the above steps (I), (II), (III), (IV) and (V), a wire-grid polarizer can be obtained.

According to the process for producing a wire-grid polarizer of the present invention, a wire-grid polarizer having a fine concavo-convex structure on a transparent substrate can be produced with high quality with high productivity. Further, a wire-grid polarizer having a large area can easily be achieved.

Further, the process for producing a wire-grid polarizer of the present invention is not limited to the above production process. For example, the process may be a process wherein the steps other than the step (III) are carried out by any one of the processes (α2), (α3) and (β). Further, the process may be a process which does not carry out the step (IV) of laminating a protective film to the metal layer (C) formed on the surface of the concavo-convex layer (B).

In the above production process, the cross-sectional shape of the ridges in the wire-grid polarizer is rectangular, but it may be in various shapes such as triangular, trapezoidal, circular or elliptic.

Further, formation of the metal layer (C) is not limited to formation only on the upper side so long as the metal layer (C) is formed on the ridges.

EXAMPLES

Now, the present invention will be described in further detail with reference to Examples and Comparative Examples. However, it should be understood that the present invention is by no means restricted to the following Examples.

Examples 1 to 4 are Examples of the present invention.
(Transmittance)

The transmittance was measured by use of an ultraviolet visible spectrophotometer (manufactured by JASCO Corporation, V-7200).

The measurement was performed by setting the polarizer of the spectrophotometer between a light source and a wire-grid polarizer so as to have its absorption axis in a direction in parallel with the long axis of fine metallic wires of the wire-grid polarizer and by entering polarized light from the front side of the wire-grid polarizer (the side with the metal layer formed thereon). The wavelengths used for the measurement were 450 nm, 550 nm and 650 nm.

A p-polarized light transmittance of at least 80% was evaluated as A, a p-polarized light transmittance of at least 70% and less than 80% was evaluated as B, and a p-polarized light transmittance of less than 70% was evaluated as X.
(Reflectance)

The reflectance was measured by use of an ultraviolet visible spectrophotometer (manufactured by JASCO Corporation, V-7200).

The measurement was performed by setting the polarizer of the spectrophotometer between a light source and a wire-grid polarizer so as to have its absorption axis in a direction in parallel with the long axis of fine metallic wires of the wire-grid polarizer and entering polarized light at an angle of 5° with respect to the front side of the wire-grid polarizer. The wavelengths used for the measurement were 450 nm, 550 nm and 650 nm.

An s-polarized light reflectance of at least 80% was evaluated as A, an s-polarized light reflectance of at least 70% and less than 80% was evaluated as B, and an s-polarized light reflectance of less than 70% was evaluated as X.
(Degree of Polarization)

The degree of polarization was calculated from the following formula.

$$\text{Degree of polarization} = ((T_p - T_s)/(T_p + T_s))^{0.5}$$

wherein Tp is the p-polarized light transmittance, and Ts is the s-polarized light transmittance.

A degree of polarization of at least 99.5% was evaluated as A, and a degree of polarization of less than 99.5% was evaluated as X.

(Preparation of Photocurable Composition)

Into a 1,000 mL four-necked flask equipped with a stirrer and a condenser tube, 60 g of a monomer 1 (manufactured by Shin-Nakamura Chemical Co., Ltd, NK Ester A-DPH, dipentaerythritol hexaacrylate), 40 g of a monomer 2 (manufactured by Shin-Nakamura Chemical Co., Ltd., NK Ester, A-NPG, neopentyl glycol diacrylate), 4.0 g of a photopolymerization initiator (manufactured by Ciba Specialty Chemicals, IRGACURE 907), 0.1 g of a fluorinated surfactant (manufactured by Asahi Glass Company, Limited, a cooligomer of fluoroacrylate ($CH_2=CHCOO(CH_2)_2(CF_2)_8F$) and butyl acrylate, fluorine content: about 30 mass %, mass average molecular weight: about 3,000), 1.0 g of a polymerization inhibitor (manufactured by Wako Pure Chemical Industries, Ltd., Q1301) and 65.0 g of cyclohexanone were put.

In a state where the interior in the flask was at room temperature and shaded, the content was stirred and homogenized for one hour. Then, with stirring the content in the flask, 100 g (solid content: 30 g) of colloidal silica was slowly added, and in a state where the interior in the flask was at room temperature and shaded, the content was stirred and homogenized for one hour. Then, 340 g of cyclohexanone was added, and in a state where the interior in the flask was at room temperature and shaded, the content was stirred for one hour to obtain a solution of a photocurable composition 1.

(Preparation of Curable Material (a1)) 1)

Into a 1,000 mL four-necked flask equipped with a stirrer and a condenser tube, 20 g of a blocked isocyanate (manufactured by Asahi Kasei Corporation, DURANATE TPA-B80E), 10 g of ethyl acrylate (manufactured by JUNSEI CHEMICAL CO., LTD.), 45 g of n-butyl acrylate (manufactured by JUNSEI CHEMICAL CO., LTD.), 20 g of 2-hydroxyethyl acrylate (manufactured by JUNSEI CHEMICAL CO., LTD.), 5 g of acrylic acid (manufactured by JUNSEI CHEMICAL CO., LTD.) and 5 g of a photopolymerization initiator (manufactured by Ciba Specialty Chemicals, IRGACURE 184) were put.

In a state where the interior in the flask was at room temperature and shaded, the content was stirred and homogenized for one hour to obtain a solution of a curable material (a1) 1.

(Preparation of Curable Material (a2) 1)

Into a 1,000 mL four-necked flask equipped with a stirrer and a condenser tube, 200 g of a pressure-sensitive adhesive (manufactured by Soken Chemical & Engineering Co., Ltd., SK-DYNE 1604N), 98 g of an epoxy resin (manufactured by DIC Corporation, EPICLON EXA-4170), 2 g of a curing agent (manufactured by TOKYO CHEMICAL INDUSTRY CO., LTD., 2-methyl-4-methylimidazole) and 200 g of toluene (manufactured by TOKYO CHEMICAL INDUSTRY CO., LTD.) were put.

In a state where the interior in the flask was at room temperature and shaded, the content was stirred and homogenized for one hour to obtain a solution of a curable material (a2) 1.

(Preparation of Curable Material (a3) 1)

Into a 1,000 mL four-necked flask equipped with a stirrer and a condenser tube, 200 g of a pressure-sensitive adhesive (manufactured by Soken Chemical & Engineering Co., Ltd., SK-DYNE 1604N), 45 g of n-butyl acrylate (manufactured by JUNSEI CHEMICAL CO., LTD.), 20 g of 2-hydroxyethyl acrylate (manufactured by JUNSEI CHEMICAL CO., LTD.), 5 g of acrylic acid (manufactured by JUNSEI CHEMICAL CO., LTD.) and 5 g of a photopolymerization initiator (manufactured by Ciba Specialty Chemicals, IRGACURE 184) were put.

In a state where the interior in the flask was at room temperature and shaded, the content was stirred and homogenized for one hour to obtain a solution of a curable material (a3) 1.

Example 1

Step (I):

The curable material (a1)) 1 was applied by spin coating to the surface of a highly transmitting polyethylene naphthalate (PEN) film (manufactured by Teijin DuPont Films Japan Limited, Teonex Q65FA, 150 mm×150 mm) having a thickness of 200 μm as a substrate film and the solvent was dried at 50° C. for 30 minutes to form an interlayer (A) 60 having a thickness of 3 μm.

Step (II):

The photocurable composition 1 was applied by spin coating to the interlayer (A) to form a coating film of the photocurable composition 1 having a thickness of 5 μm.

A quartz mold having a plurality of grooves formed at certain pitches so as to extend in parallel with one another through the respective flat portions between adjacent grooves (area: 150 mm×150 mm, pattern area: 100 mm×100 mm, groove pitch Pp: 160 nm, groove width Dbp: 65 nm, groove depth Hp: 200 nm, groove length: 100 mm, cross-sectional shape of groove: substantially isosceles triangle) was pressed against the coating film of the photocurable composition 1 at 25° C. under 0.5 MPa (gauge pressure) so that the grooves were in contact with the coating film of the photocurable composition 1.

While this state was maintained, light from a high pressure mercury lamp (frequency: from 1.5 kHz to 2.0 kHz, main wavelength light: 255 nm, 315 nm and 365 nm, irradiation energy at 365 nm: 1,000 mJ) was applied from the PEN film side for 15 seconds to cure the photocurable composition 1, and the quartz mold was slowly separated, whereby a concavo-convex layer (B) having a plurality of convex ridges corresponding to the grooves of the quartz mold and flat portions between adjacent ridges (ridge pitch Pp: 160 nm, width Dbp of ridge base portion: 65 nm, ridge height Hp: 200 nm, θ1 and θ2:80.8°) was formed.

Step (III):

Using a vacuum vapor deposition apparatus (manufactured by SHOWA SHINKU CO., LTD., SEC-16CM) capable of changing the gradient of the concavo-convex layer (B) facing the deposition source, aluminum was deposited on the ridges of the concavo-convex layer (B) by an oblique vapor deposition method to form a metal layer (C).

Figure 20:
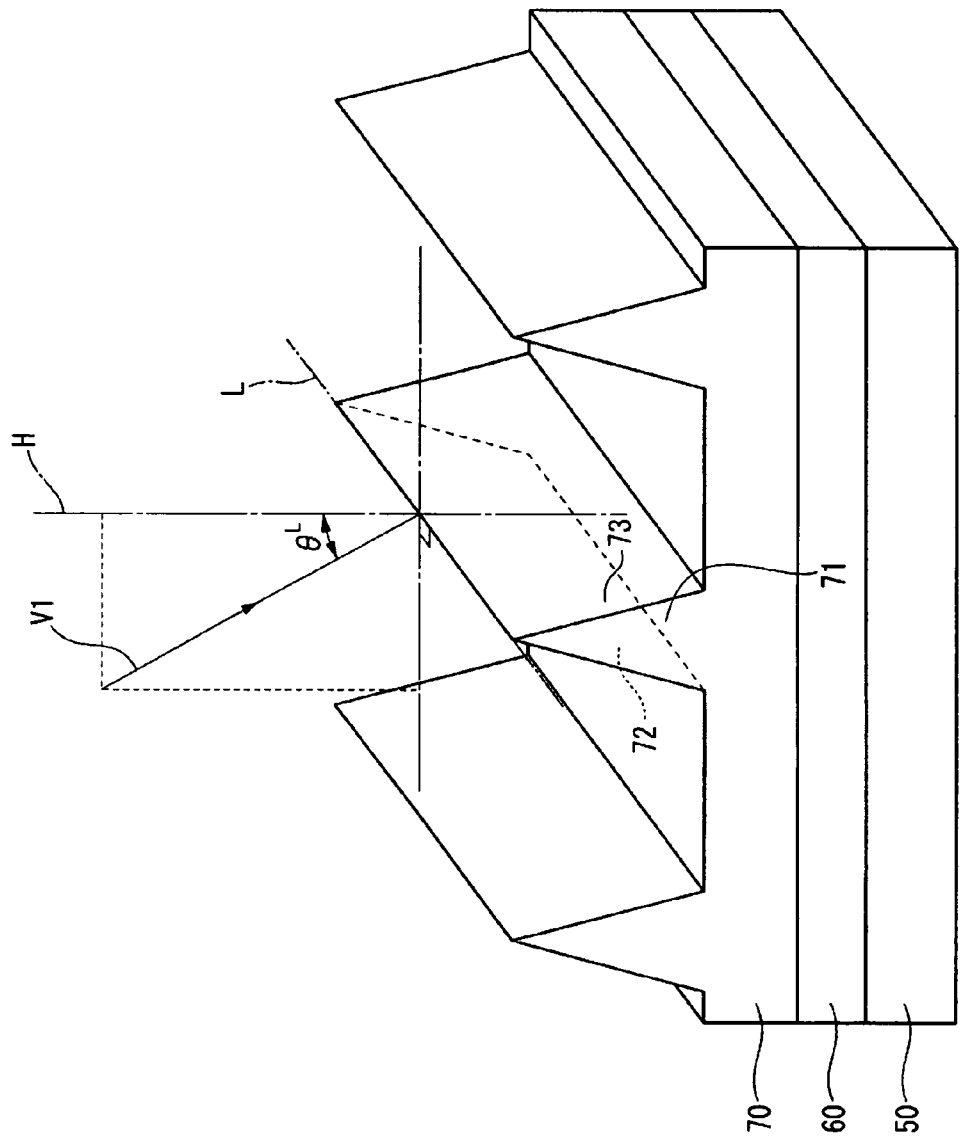
FIG. 20 is an oblique view illustrating a state before formation of a metal layer (C) in Examples of the present invention.

In this process, as shown in FIG. 20, the vapor deposition was performed once from the direction V1 substantially orthogonal to the longitudinal direction L of each ridge 71 and forming the angle $\theta^L$ toward the first lateral face 72 side with respect to the height direction H of the ridge 71 (i.e. from the first lateral face side). Then, the angle $\theta^L$ in the vapor deposition, and the thickness Hm' of the metal layer formed on flat areas having no ridges 71 formed by the vapor deposition were the angle and the thickness shown in Table 1. Hm' was measured by a film thickness monitor including a quartz vibrator as a film thickness sensor.

Figure 21:
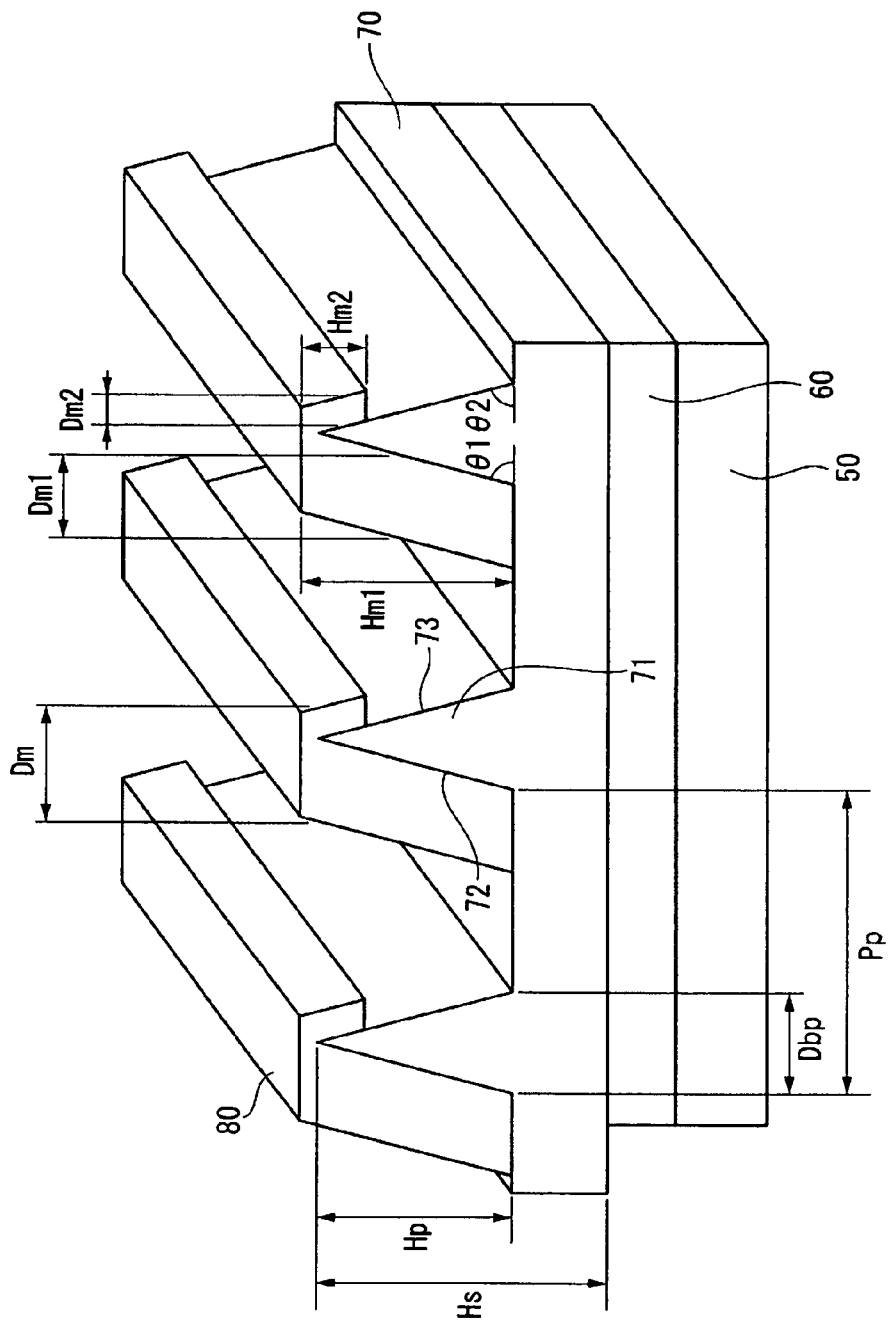
FIG. 21 is an oblique view illustrating a laminate after the step (III) in Examples of the present invention.

A laminate comprising the substrate film 50, the interlayer (A) 60, the concavo-convex layer (B) 70 and the metal layer (C) 80 obtained in the step (III) is shown in FIG. 21.

Further, the measured values of the dimensions of the metal layer (C) 80 (fine metallic wires) are shown in Table 1.

The dimensions of the metal layer (C) 80 (fine metallic wires) were obtained by measuring maximum values of the respective dimensions (here, Dm, Dm1, Dm2, Hm1 and Hm2 are values defined as follows) of the metal layer (C) 80 on five ridges in a transmission electron microscope image of a cross-section of a laminate comprising the substrate film 50, the interlayer (A) 60, the concavo-convex layer (B) 70 and the metal layer (C) 80, and averaging these five maximum values.

Dm1: a maximum thickness in the width direction of a ridge of the metal layer (C) 80 covering a first lateral face 72 of the ridge 71.

Dm2: a maximum thickness in the width direction of a ridge of the metal layer (C) 80 covering a second lateral face 73 of the ridge 71.

Dm: the width of the metal layer (C) 80 at the apex of the ridge 71, substantially equal to the sum of Dm1 and Dm2.

Hm1: the height of the metal layer (C) 80 covering the first lateral face 72 of the ridge 71.

Hm2: the height of the metal layer (C) 80 covering the second lateral face 73 of the ridge 71.

Step (IV):

A protective film (manufactured by FUJIMORI KOGYO CO., LTD., MASTACK PC-751, 150 mm×150 mm) having a thickness of 55 μm was laminated to the Al surface of the metal layer (C), followed by heat treatment under pressure for 30 minutes in an autoclave at 40° C. under 5 kgf/cm².

Step (V):

A laminate comprising the PEN film, the interlayer (A), the concavo-convex layer (B), the metal layer (C) and the protective film was subjected to heat treatment at 150° C. for one hour. Then, the laminate was separated from the PEN film.

Then, a photocurable adhesive (manufactured by TOAGOSEI CO., LTD., LCR0632) was applied by spin coating to the surface of a glass plate (manufactured by Asahi Glass Company, Limited, AN100, 150 mm×150 mm) comprising alkali free glass having a thickness of 0.4 mm to form a coating film (adhesive layer) having a thickness of 2 μm. The laminate separated from the PEN film was disposed on the coating film so that the interlayer (A) 60 faced the coating film, they were laminated under a pressure of 1 N from above the protective film, light from a high pressure mercury lamp (frequency: from 1.5 kHz to 2.0 kHz, main wavelength light: 255 nm, 315 nm and 365 nm, irradiation energy at 365 nm: 1,000 mJ) was applied for 15 seconds from the protective film side to cure the photocurable adhesive, whereby the laminate was laminated to the glass plate surface, thereby to obtain a wire-grid polarizer. With respect to the obtained wire-grid polarizer, the dimensions of the metal layer, the transmittance, the reflectance and the degree of polarization were measured.

Example 2

In the same manner as in Example 1 except that the curable material (a2) 1 was used, the steps (I) to (IV) were carried out, and in the same manner as in Example 1 except that in the step (V), the heat treatment before the laminate comprising the interlayer (A), the concavo-convex layer (B), the metal layer (C) and the protective film was separated from the PEN film was carried out at 180° C. for 2 hours, a wire-grid polarizer was obtained. With respect to the obtained wire-grid polarizer, the dimensions of the metal layer, the transmittance, the reflectance and the degree of polarization were measured.

Example 3

Step (I):

The curable material (a3) 1 was applied by spin coating to the surface of the same PEN film as in Example 1, and the solvent was dried at 50° C. for 30 minutes to form an interlayer (A) having a thickness of 3 μm.

Step (II):

A 20% toluene solution of polymethyl methacrylate (ACRYPET, molecular weight: about 15,000, manufactured by Sumitomo Chemical Co., Ltd.) was applied by spin coating to the surface of the interlayer (A) to form a coating film of polymethyl methacrylate having a thickness of 10 μm.

A Ni mold having a plurality of grooves formed at certain pitches so as to extend in parallel with one another through the respective flat portions between adjacent grooves (area: 150 mm×150 mm, pattern area: 100 mm×100 mm, groove pitch Pp: 160 nm, groove width Dbp: 65 nm, groove depth Hp: 200 nm, groove length: 100 mm, cross-sectional shape of groove: substantially isosceles triangle) was pressed against the coating film of polymethyl methacrylate at 120° C. under 6.5 MPa (gauge pressure) so that the grooves were in contact with the coating film of polymethyl methacrylate.

While this state was maintained, the temperature of the Ni mold was adjusted to 50° C., and the Ni mold was slowly separated, whereby a concavo-convex layer (B) having a plurality of ridges corresponding to the grooves of the Ni mold and flat portions between adjacent ridges (pitch Pp of ridge 54a: 160 nm, width Dbp of base portion of ridge 54a: 65 nm, height Hp of ridge 54a: 200 nm, θ1 and θ2:80.8°) was formed.

Step (III):

In the same manner as in Example 1, aluminum was deposited on the ridges of the concavo-convex layer (B) by an oblique vapor deposition method to form a metal layer (C).

Step (IV):

In the same manner as in Example 1, a protective film was laminated to the Al surface of the metal layer (C).

Step (V):

In the same manner as in Example 1 except that in the step (V), instead of the heat treatment at 150° C. for one hour, light from a high pressure mercury lamp (frequency: from 1.5 kHz to 2.0 kHz, main wavelength light: 255 nm, 315 nm and 365 nm, irradiation energy at 365 nm: 1,000 mJ) was applied for 30 seconds from the PEN film side, a wire-grid polarizer was obtained. With respect to the obtained wire-grid polarizer, dimensions of the metal layer, the transmittance, the reflectance and the degree of polarization were measured.

Example 4

Step (I):

A pressure-sensitive adhesive (manufactured by Soken Chemical & Engineering Co., Ltd., SK-DYNE 1604N) was applied by spin coating to the surface of a PET film (manufactured by PANAC CO., LTD, PANA-PEEL PET 100TP-01, 150 mm×150 mm) having a thickness of 100 μm, to the surface of which release coating was applied, and the solvent was dried at 50° C. for 30 minutes to form an interlayer (A) having a thickness of 8 μm.

Step (II):

In the same manner as in Example 1 except that the substrate film and the interlayer prepared in the step (I) were used, a concavo-convex layer (B) having a plurality of ridges corresponding to the grooves of the quartz mold and flat portions between adjacent ridges (pitch Pp of ridge: 160 nm, width Dbp of base portion of ridge: 65 nm, height Hp of ridge: 200 nm, θ1 and θ2:80.8°) was formed.

Step (III):

In the same manner as in Example 1 except that the substrate film and the interlayer prepared in the step (I) were used, vacuum deposition was carried out.

Step (IV):

In the same manner as in Example 1 except that the substrate film and the interlayer prepared in the step (I) were used, a protective film was laminated.

Step (V):

A laminate comprising the PET film, the release layer, the interlayer (A), the concavo-convex layer (B), the metal layer (C) and the protective film was separated between the release layer and the interlayer (A). A solution of aminosilane (manufactured by Shin-Etsu Chemical Co., Ltd., KBM 603)/water/isopropyl alcohol=0.1/63/47 (volume ratio) was applied by spin coating to the surface of a glass plate (manufactured by Asahi Glass Company, Limited: AN100, 150 mm×150 mm) comprising alkali free glass having a thickness of 0.4 mm, and dried at 100° C. for 50 minutes. On the resulting coating film, the laminate separated from the release layer was disposed so that the interlayer (A) 60 faced the coating film, and they were laminated under a pressure of 1 N from above the protective film to laminate the laminate on the glass plate surface, whereby a wire-grid polarizer was obtained. With respect to the obtained wire-grid polarizer, the dimensions of the metal layer, the transmittance, the reflectance and the degree of polarization were measured.

The results of measurement of Examples 1 to 4 are shown in Tables 1 and 2.

TABLE 1

| | Dm (nm) | Dm1 (nm) | Dm2 (nm) | Hm1 (nm) | Hm2 (nm) | Pp (nm) | Dbp (nm) | Hp (nm) | θL (°) | Hm' (nm) |
|---|---|---|---|---|---|---|---|---|---|---|
| Ex. 1 | 55 | 50 | 5 | 210 | 10 | 160 | 65 | 200 | 30 | 50 |
| Ex. 2 | 55 | 50 | 5 | 210 | 10 | 160 | 65 | 200 | 30 | 50 |
| Ex. 3 | 55 | 50 | 5 | 210 | 10 | 160 | 65 | 200 | 30 | 50 |
| Ex. 4 | 55 | 50 | 5 | 210 | 10 | 160 | 65 | 200 | 30 | 50 |

TABLE 2

| | 450 nm | | | 550 nm | | | 650 nm | | |
|---|---|---|---|---|---|---|---|---|---|
| | p-polarized light transmittance | s-polarized light reflectance | Degree of polarization | p-polarized light transmittance | s-polarized light reflectance | Degree of polarization | p-polarized light transmittance | s-polarized light reflectance | Degree of polarization |
| Ex. 1 | A | A | A | A | A | A | A | A | A |
| Ex. 2 | A | A | A | A | A | A | A | A | A |
| Ex. 3 | A | A | A | A | A | A | A | A | A |
| Ex. 4 | A | A | A | A | A | A | A | A | A |

As shown in Table 2, according to the process for producing a wire-grid polarizer of the present invention, a high quality wire-grid polarizer having a plurality of fine ridges on a glass plate could be obtained.

The production process of the present invention is applicable to a roll to roll method and improves the productivity, and easily achieves a concavo-convex layer having a large area, and is thereby useful as a process for producing an article having a fine concavo-convex structure on its surface, such as a wire-grid polarizer, in a short time.

Industrial Applicability

The production process of the present invention is applicable to production of an article having a fine concavo-convex structure on its surface such as a light-transmitting substrate for an optical element such as a wire-grid polarizer, a prism, a light guide plate or a moth eye, a support substrate for a biosensor, a patterning substrate for a cell culture sheet, a process member for preparation of a member for a semiconductor, or a process member for preparation of a member for a magnetic disk. Particularly, an article having a metal layer formed on ridges of the fine concavo-convex structure is used as a wire-grid polarizer.

This application is a continuation of PCT Application No. PCT/JP2010/061204, filed Jun. 30, 2010, which is based upon and claims the benefit of priority from Japanese Patent Application No. 2009-157292 filed on Jul. 1, 2009. The contents of those applications are incorporated herein by reference in its entirety.

Reference Symbols

10, 20: article, 11, 21: substrate film, 12, 22: interlayer (A), 13, 23: concavo-convex layer (B), 14, 24: protective film, 15, 25: laminate, 16, 26: transparent substrate, 17: adhesive layer, 30: mold, 50: substrate film, 60: interlayer (A), 70: concavo-convex layer (B), 71: ridge, 80: metal layer (C).

What is claimed is:

1. A process for producing an article having a fine concavo-convex structure on its surface, which comprises the following steps (I), (II) and (V):
    (I) a step of forming an interlayer (A) on the surface of a substrate film;
    (II) a step of forming a concavo-convex layer (B) having a fine concavo-convex structure on its surface, on the surface of the interlayer (A) by imprinting technology; and
    (V) a step of separating a laminate comprising the interlayer (A) and the concavo-convex layer (B) from the substrate film and then laminating the laminate to the surface of a transparent substrate so that the interlayer (A) faces the transparent substrate side, wherein the interlayer (A) and the transparent substrate contact each other directly or through an adhesive layer, wherein when the interlayer (A) and the transparent substrate contact each other through an adhesive layer, the adhesive layer contacts a surface of the interlayer (A) which is opposite to the surface of the interlayer (A) on which the concavo-convex layer (B) is formed.

2. The process for producing an article having a fine concavo-convex structure on its surface according to claim 1, wherein the interlayer (A) is a layer comprising a curable material; wherein the curable material is in an uncured state in step (I); wherein the curable material is in a partially cured state in step (II); wherein the curable material has pressure-sensitive adhesion to the substrate film in an uncured or partially cured state; wherein the pressure-sensitive adhesion to the substrate film is reduced as the curing proceeds; and wherein the pressure-sensitive adhesion is sufficiently reduced in step (V), such that the interlayer (A) can be separated from the substrate film.

3. The process for producing an article having a fine concavo-convex structure on its surface according to claim 2, wherein the curable material is a curable material (a1) containing a photocurable compound and a thermosetting compound, a curable material (a2) containing a thermoplastic resin and a thermosetting compound, or a curable material (a3) containing a thermoplastic resin and a photocurable compound.

4. The process for producing an article having a fine concavo-convex structure on its surface according to claim 3, wherein the thermoplastic resin is a resin having a glass transition temperature (Tg) of at least 10° C. and at most 40° C.

5. The process for producing an article having a fine concavo-convex structure on its surface according to claim 1, wherein the substrate film is a substrate film having a release layer on its surface, and the interlayer (A) is a layer formed by applying a pressure-sensitive adhesive to the surface of the release layer of the substrate film.

6. The process for producing an article having a fine concavo-convex structure on its surface according to claim 1, wherein the steps (I) and (II) are carried out by a roll to roll method.

7. The process for producing an article having a fine concavo-convex structure on its surface according to claim 1, which further comprises the following step (IV) between the steps (II) and (V):
(IV) a step of laminating a protective film to the surface of the concavo-convex layer (B).

8. A process for producing a wire-grid polarizer, which comprises the following steps (I), (II), (III) and (V):
(I) a step of forming an interlayer (A) on the surface of a substrate film;
(II) a step of forming a concavo-convex layer (B) having a plurality of ridges on its surface, on the surface of the interlayer (A) by imprinting technology;
(III) a step of forming a metal layer (C) on the ridges of the concavo-convex layer (B); and
(V) a step of separating a laminate comprising the interlayer (A), the concavo-convex layer (B) and the metal layer (C) from the substrate film and laminating the laminate to the surface of a transparent substrate so that the interlayer (A) faces the transparent substrate side, wherein the interlayer (A) and the transparent substrate contact each other directly or through an adhesive layer, wherein when the interlayer (A) and the transparent substrate contact each other through an adhesive layer, the adhesive layer contacts a surface of the interlayer (A) which is opposite to the surface of the interlayer (A) on which the concavo-convex layer (B) is formed.

9. The process for producing a wire-grid polarizer according to claim 8, wherein the interlayer (A) is a layer comprising a curable material; wherein the curable material is in an uncured state in step (I); wherein the curable material is in a partially cured state in step (II); wherein the curable material has pressure-sensitive adhesion to the substrate film in an uncured or partially cured state; wherein the pressure-sensitive adhesion to the substrate film is reduced as the curing proceeds; and wherein the pressure-sensitive adhesion is sufficiently reduced in step (V), such that the interlayer (A) can be separated from the substrate film.

10. The process for producing a wire-grid polarizer according to claim 9, wherein the curable material is a curable material (a1) containing a photocurable compound and a thermosetting compound, a curable material (a2) containing a thermoplastic resin and a thermosetting compound, or a curable material (a3) containing a thermoplastic resin and a photocurable compound.

11. The process for producing a wire-grid polarizer according to claim 10, wherein the thermoplastic resin is a resin having a glass transition temperature (Tg) of at least 10° C. and at most 40° C.

12. The process for producing a wire-grid polarizer according to claim 8, wherein the substrate film is a substrate film having a release layer on its surface, and the interlayer (A) is a layer formed by applying a pressure-sensitive adhesive to the surface of the release layer of the substrate film.

13. The process for producing a wire-grid polarizer according to claim 8, which further comprises the following step (IV) between the steps (III) and (V):
(IV) a step of laminating a protective film on the concavo-convex layer (B) and the metal layer (C).

14. The process according to claim 1, wherein the transparent substrate is selected from the group consisting of glass and quartz glass.

15. The process according to claim 8, wherein the transparent substrate is selected from the group consisting of glass and quartz glass.

16. The process according to claim 1, wherein the substrate film is a film of resin.

17. The process according to claim 8, wherein the substrate film is a film of resin.

\* \* \* \* \*